(12) United States Patent
Kim et al.

(10) Patent No.: US 8,535,874 B2
(45) Date of Patent: Sep. 17, 2013

(54) FLUORENE-BASED POLYMER CONTAINING URETHANE GROUPS, PREPARATION METHOD THEREOF AND NEGATIVE-TYPE PHOTOSENSITIVE RESIN COMPOSITION COMPRISING THE SAME

(75) Inventors: Han Soo Kim, Daejeon (KR); Sung Hyun Kim, Daejeon (KR); Dong Chang Choi, Daejeon (KR); Kyung Soo Choi, Hanam (KR); Ho Chan Ji, Daejeon (KR); Min Young Lim, Seongnam (KR); Geun Young Cha, Daejeon (KR); Yoon Hee Heo, Daejeon (KR); Ji Heum Yoo, Daejeon (KR); Sun Hwa Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 811 days.

(21) Appl. No.: 12/671,348

(22) PCT Filed: Sep. 26, 2008

(86) PCT No.: PCT/KR2008/005707
§ 371 (c)(1),
(2), (4) Date: Jan. 29, 2010

(87) PCT Pub. No.: WO2009/048231
PCT Pub. Date: Apr. 16, 2009

(65) Prior Publication Data
US 2010/0201925 A1    Aug. 12, 2010

(30) Foreign Application Priority Data

Oct. 11, 2007  (KR) ......................... 10-2007-0102679
Sep. 25, 2008  (KR) ......................... 10-2008-0094047

(51) Int. Cl.
*G03F 7/004* (2006.01)
*C08L 75/04* (2006.01)
*C08G 61/12* (2006.01)

(52) U.S. Cl.
USPC ............ 430/284.1; 528/74; 528/73; 525/445; 349/106

(58) Field of Classification Search
None
See application file for complete search history.

(56) References Cited

U.S. PATENT DOCUMENTS 5,858,614 A * 1/1999 Sato et al. ................. 430/280.1
2003/0204459 A1* 10/2003 Schulman ...................... 705/35

FOREIGN PATENT DOCUMENTS

| JP | 06301322 A | 10/1994 |
| JP | 2001131242 a * | 5/2001 |
| JP | 2003113205 A | 4/2003 |
| JP | 2004083855 A | 3/2004 |
| JP | 2005-165294 A | 6/2005 |
| WO | 2005/049689 A2 | 6/2005 |

OTHER PUBLICATIONS

English translation of JP 2001-131242, A (2001) from machine translation from AIPN Japan Patent Office National Center for Industrial Property Information and Training, generated Oct. 12, 2012, with 13 pages.*
English translation of JP, 2004-083855, A (2004) from machine translation from AIPN Japan Patent Office National Center for Industrial Property Information and Training, generated May 14, 2013, 34 pages.*
English translation of JP, 2005-165294, A (1994) from machine translation from AIPN Japan Patent Office National Center for Industrial Property Information and Training, generated May 3, 2013, 31 pages and 33 pages (total 64 pages).*
Office Action from Taiwanese Patent Application No. 97139181 issued Jun. 25, 2012 along with English translation, 7 pages.

* cited by examiner

*Primary Examiner* — Cynthia Hamilton
(74) *Attorney, Agent, or Firm* — Rothwell, Figg, Ernst & Manbeck, P.C.

(57) ABSTRACT

Provided is a novel fluorene-based polymer having urethane bonds and a method for preparing the fluorene-based polymer. According to the method, a diol compound is condensed with a diisocyanate instead of an acid dianhydride, and then an acid anhydride is reacted with the reaction mixture to introduce desired acid groups into the final polymer. Further provided is a negative-type photosensitive resin composition comprising of the fluorene-based polymer as a binder resin. The composition exhibits improved chemical resistance, good development margin and high sensitivity due to presence of the acid groups despite the low molecular weight of the fluorene-based polymer.

19 Claims, 1 Drawing Sheet

FLUORENE-BASED POLYMER CONTAINING URETHANE GROUPS, PREPARATION METHOD THEREOF AND NEGATIVE-TYPE PHOTOSENSITIVE RESIN COMPOSITION COMPRISING THE SAME

CROSS REFERENCE TO RELATED APPLICATIONS

This application is a 35 U.S.C. §371 National Phase Entry Application from PCT/KR2008/005707, filed Sep. 26, 2008, and designating the United States, which claims priority under 35 U.S.C. §119 to Korean Patent Application No. 10-2007-0102679 filed Oct. 11, 2007 and Korean Patent Application No. 10-2008-0094047 filed Sep. 25, 2008, which are incorporated herein in their entireties.

TECHNICAL FIELD

The present invention relates to a fluorene-based polymer containing urethane groups, a method for preparing the fluorene-based polymer, and a negative-type photosensitive resin composition comprising the same. More specifically, the present invention relates to a novel fluorene-based polymer whose acid value and molecular weight are not high, and a photosensitive resin composition comprising the fluorene-based polymer to achieve good development margin, improved chemical resistance and high sensitivity.

BACKGROUND ART

Liquid crystal displays (LCDs) are typically applied to notebook personal computers and liquid crystal display televisions. Color filters are essential components of liquid crystal display devices. Pigment dispersion processes are presently the most widely used to produce color filters.

Photosensitive resin compositions suitable for use in the production of color filters by pigment dispersion processes are required to be excellent in terms of smoothness, resolution, developability, heat resistance, light resistance, spectroscopic properties, simplification of the production process, sensitivity and storage stability.

A general fluorene-based polymer is prepared by polycondensation of a diol compound containing a fluorene moiety and an acid dianhydride. A negative-type photosensitive resin composition comprising the fluorene-based polymer has good adhesion to a substrate but is vulnerable to development due to the high acid value and low molecular weight of the fluorene-based polymer.

For better development margin and chemical resistance of the conventional fluorene-based polymer, the equivalent ratio between the diol compound and the acid dianhydride, both of which contain reactive groups, must be close to 1:1. However, a portion of the less soluble acid dianhydride remains unreacted to impair the storage stability of the polymer and becomes a cause of increasing the acid value of the polymer. As a result, a pattern formed using the polymer tends to be peeled off. Meanwhile, the use of the diol compound in a larger amount than the acid dianhydride leads to a decrease in molecular weight as well as in acid value, resulting in poor development margin and chemical resistance of the polymer.

DISCLOSURE

Technical Problem

The present invention has been made in an effort to solve the problems of the prior art, and it is an object of the present invention to provide a fluorene-based polymer containing urethane groups that exhibits good development margin, improved chemical resistance and high sensitivity despite its low molecular weight while maintaining good adhesion to a substrate, which is an inherent property of all fluorene-based polymers.

Another object of the present invention is to provide a method for preparing the fluorene-based polymer.

Still another object of the present invention is to provide a negative-type photosensitive resin composition comprising the fluorene-based polymer.

Technical Solution

In accordance with an aspect of the present invention, there is provided a fluorene-based polymer having urethane bonds, represented by Formula 1:

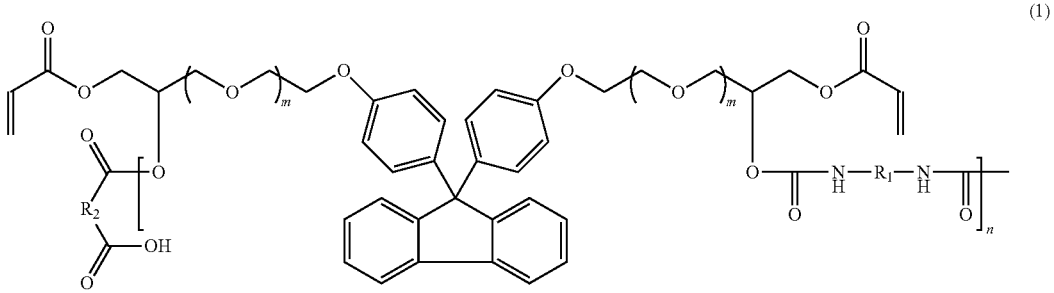

(1)

wherein $R_1$ is a divalent hydrocarbon group derived from a diisocyanate, $R_2$ is a constituent group of an acid derived from an acid anhydride, m is from 0 to 3, and n is from 3 to 8.

In accordance with another aspect of the present invention, there is provided a method for preparing the fluorene-based polymer of Formula 1, the method comprising reacting an excess of a diol compound containing a fluorene moiety with a diisocyanate and reacting the reaction mixture with an acid anhydride.

In accordance with yet another aspect of the present invention, there is provided a negative-type photosensitive resin composition comprising the fluorene-based polymer of Formula 1.

Advantageous Effects

The fluorene-based polymer of the present invention is prepared using an excess of a diol compound containing a fluorene moiety. The use of the excess diol compound increases the proportion of unsaturated double bonds as reactive groups in the polymer to attain high sensitivity. In addition, the acid value of the fluorene-based polymer can be readily controlled to a low level. Furthermore, the fluorene-based polymer exhibits good development margin and improved chemical resistance due to the presence of urethane bonds despite its low molecular weight.

BEST MODE

Figure 1:
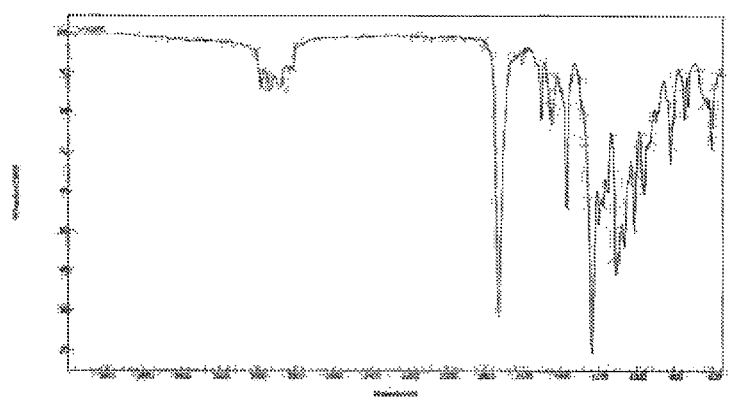
FIGS. 1 and 2 are FT-IR spectra of fluorene-based polymers prepared in Preparative Examples 1 and 2, respectively.

Preferred embodiments of the present invention will now be described in greater detail.

The present invention provides a fluorene-based polymer having urethane bonds represented by Formula 1:

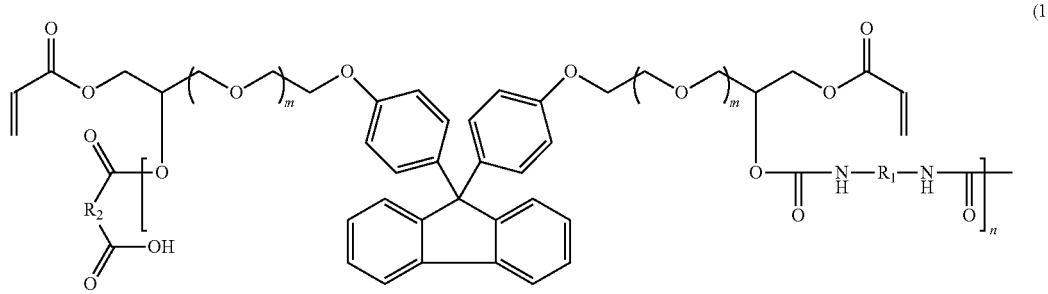

wherein $R_1$ is a divalent hydrocarbon group derived from a diisocyanate, $R_2$ is a constituent group of an acid derived from an acid anhydride, m is from 0 to 3, and n is from 3 to 8.

The present invention also provides a method for preparing the fluorene-based polymer of Formula 1.

Specifically, the method of the present invention comprises reacting an excess of a diol compound containing a fluorene moiety with a diisocyanate and reacting the reaction mixture with an acid anhydride.

The individual steps of the method will be explained in detail below.

In the first step, an excess of a diol compound containing a fluorene moiety represented by Formula 2:

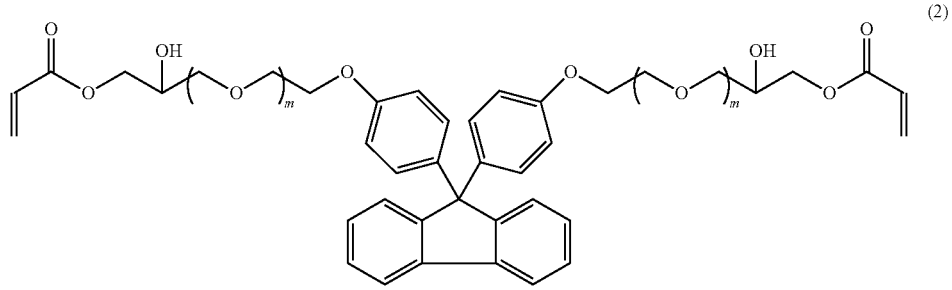

wherein each m is from 0 to 3, is reacted with a diisocyanate represented by Formula 3:

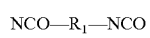

NCO—$R_1$—NCO  (3)

wherein $R_1$ is a divalent hydrocarbon group selected from aliphatic and aromatic hydrocarbon groups, by heating in an aprotic solvent in the presence of a known activated catalyst to form urethane bonds.

Specifically, the aliphatic hydrocarbon groups include ethylene, propylene, butylene, amylene and hexylene groups, and the aromatic hydrocarbon groups include arylene groups. The kind of the activated catalyst is selected according to the reactivity of the reactants.

Specific examples of diisocyanate compounds that can be represented by Formula 3 are selected from the group consisting of, but not limited to, trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate, 2,4,4-trimethylhexamethylene diisocyanate, ω,ω'-diisocyanato-1,3-dimethylbenzene, ω,ω'-diisocyanato-1,4-dimethylbenzene, ω,ω'-diisocyanato-1,3-diethylbenzene, 1,4-tetramethylxylene diisocyanate, 1,3-tetramethylxylene diisocyanate, isophorone diisocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylene bisisocyanate methylcyclohexane, 2,5-isocyanatomethyl bicyclo[2,2,2]heptane, and 2,6-isocyanatomethyl bicyclo[2,2,1]heptane.

According to a conventional method, a fluorene-based polymer is prepared by the reaction of a diol compound with an acid dianhydride. In contrast, according to the method of the present invention, a diol compound is reacted with a diisocyanate instead of an acid dianhydride to form urethane bonds, and then residual alcohol groups of the diol compound are reacted with an acid anhydride. The diol compound and the diisocyanate are reacted in an equivalent ratio of 1.1:1-3:1. That is, the method of the present invention is characterized by the use of an excess of the diol compound for the reaction with the diisocyanate. As a result of the reaction, the proportion of unsaturated double bonds as the reactive groups of the diol compound in the final polymer increases to attain improved sensitivity. The residual alcohol groups of the diol compound remaining after the reaction of the diol compound with the diisocyanate are reacted with an acid anhydride in the subsequent step.

The diol compound of Formula 2 may be contained another diol compound represented by Formula 4:

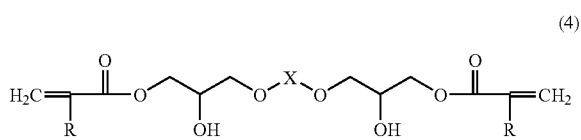

(4)

wherein each R is a hydrogen atom or a methyl group, and X is selected from the group consisting of $C_1$-$C_{10}$ alkylene, —$(CH_2CH_2O)_nCH_2CH_2$— (n is an integer from 1 to 10), —$(CHCH_3CH_2)_nOCHCH_3CH_2$— (n is an integer from 1 to 10),

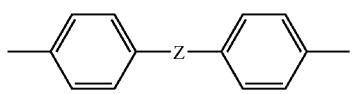

(Z is a direct bond or is selected from the group consisting of $C_1$-$C_6$ alkylene, ketone, —O—, —S—, —$SO_2$—, hexafluoropropylene, —$OC_6H_4O$— and —$OC_6H_4C(CH_3)_2C_6H_4O$—), 9,9-bisphenolfluorenyl, and 9,9-bis(4'-ethoxyphenyl)fluorenyl.

In the second step, an acid anhydride is reacted with unreacted alcohol groups of the diol compound used in the first step to introduce acid groups into the final polymer.

Specifically, no acid anhydride is added to form urethane bonds in the first step, and instead, an acid anhydride is reacted with the unreacted alcohol groups of the diol compound to introduce acid groups into the final polymer in the second step. Accordingly, the method of the present invention offers an advantage in that the acid value of the polymer can be readily controlled to a low level. In addition, the presence of urethane bonds in the fluorene-based polymer improves the development margin and chemical resistance of the fluorene-based polymer despite low molecular weight of the polymer.

The acid anhydride used in the present invention is selected from the group consisting of, but not limited to, succinic anhydride, glutaric anhydride, methylsuccinic anhydride, maleic anhydride, methylmaleic anhydride, phthalic anhydride, 1,2,3,6-tetrahydrophthalic anhydride, 3,4,5,6-tetrahydrophthalic anhydride, hexahydrophthalic anhydride and cis-5-norbornene-(endo, exo)-2,3-dicarboxylic anhydride.

The fluorene-based polymer of the present invention according to the one preferred embodiment is prepared by the following reaction 1:

Reaction 1

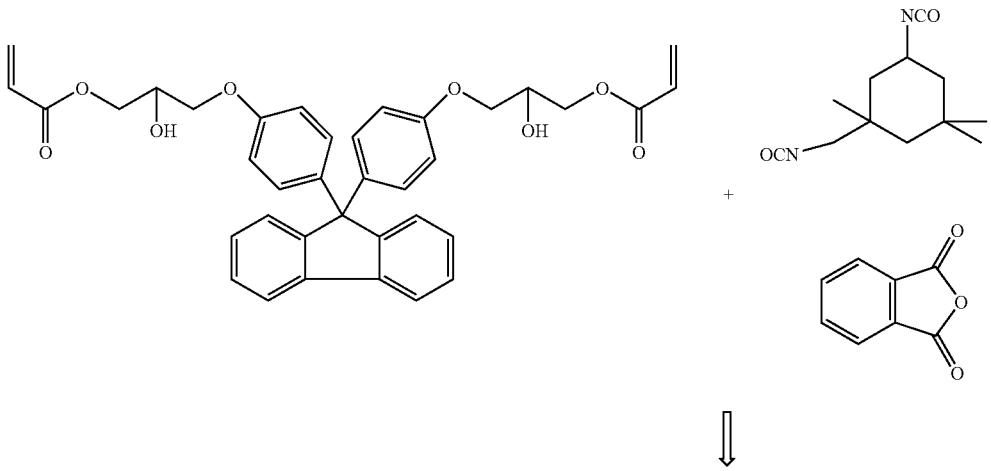

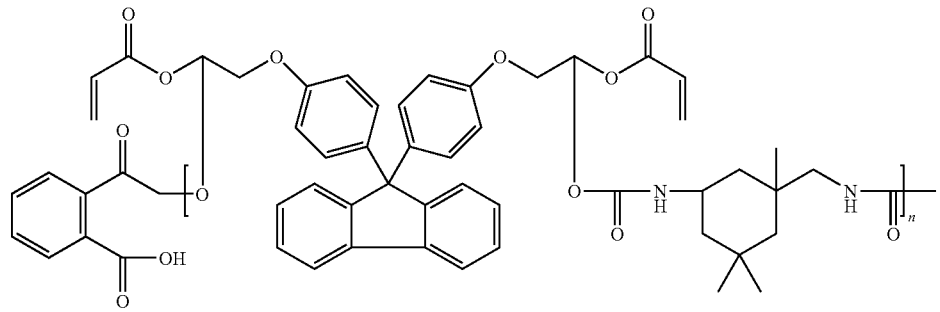

The fluorene-based polymer of Formula 1 has an acid value of 60 to 120 KOHmg/g and a weight average molecular weight of 3,000 to 6,000 on a polystyrene basis.

The acid value of the fluorene-based polymer is determined by measuring the amount of an aqueous solution of potassium hydroxide used to titrate a solution of a given amount of the fluorene-based polymer in a particular solvent.

The present invention also provides a photosensitive resin composition comprising the fluorene-based polymer of Formula 1.

Specifically, the photosensitive resin composition of the present invention comprises 1) the fluorene-based polymer of Formula 1 containing urethane groups as a binder resin, 2) a solvent, 3) a polyfunctional crosslinking agent, 4) a photoinitiator, 5) a coloring pigment and optionally at least one additive.

The content of the fluorene-based polymer as a binder resin 1) is determined taking into account the processability of the photosensitive resin composition. The fluorene-based polymer is preferably present in an amount of 1 to 30% by weight, based on the total weight of the composition.

The fluorene-based polymer may be used in combination with at least one resin selected from urethane, polyester and acrylic resins.

The solvent 2) is not particularly limited and can be appropriately selected according to the intended purpose. Specifically, the solvent 2) can be selected from the group consisting of: alcohols, such as methanol, ethanol, n-propanol, isopropanol, n-butanol, sec-butanol, and n-hexanol; ketones, such as acetone, methyl ethyl ketone, methyl isobutyl ketone, cyclohexanone, and diisobutyl ketone; esters, such as ethyl acetate, butyl acetate, n-amyl acetate, methyl sulfate, ethyl propionate, methyl phthalate, ethyl benzoate, and methoxypropyl acetate; aromatic hydrocarbons, such as toluene, xylene, benzene, and ethylbenzene; halogenated hydrocarbons, such as carbon tetrachloride, trichloroethylene, chloroform, 1,1,1-trichloroethane, methylene chloride, and monochlorobenzene; ethers, such as tetrahydrofuran, diethyl ether, ethylene glycol monomethyl ether, ethylene glycol monoethyl ether, and 1-methoxy-2-propanol; dimethylformamide; dimethylacetamide; dimethylsulfoxide; and sulfolane. These solvents may be used alone or as a mixture of two or more thereof.

The solvent 2) serves to dissolve, emulsify or disperse the final photosensitive composition, and is preferably present in an amount of 30 to 90% by weight, based on the total weight of the composition.

The polyfunctional crosslinking agent 3) is not particularly limited and can be appropriately selected according to the intended purpose. The polyfunctional crosslinking agent 3) is used in an amount such that the strength of a photosensitive layer formed using the composition after curing is improved without affecting the developability of the photosensitive layer. Examples of polyfunctional crosslinking agents suitable for use in the present invention include, but are not limited to, polyethylene glycol mono(meth)acrylate, polypropylene glycol mono(meth)acrylate, phenoxyethyl (meth)acrylate, polyethylene glycol (meth)acrylate, polypropylene glycol (meth)acrylate, trimethylolethane triacrylate, trimethylolpropane triacrylate, neopentyl glycol (meth)acrylate, pentaerythritol tetraacrylate, pentaerythritol triacrylate, dipentaerythritol pentaacrylate, and dipentaerythritol hexaacrylate.

The polyfunctional crosslinking agent 3) may be caprolactone-introduced one. Such caprolactone-introduced polyfunctional crosslinking agents include KAYARAD DPCA-20, 30, 60 and 120, FA-2D, FA1DT and FA-3 introduced into dipentaerythritol, KAYARAD TC-110S introduced into tetrahydrofuryl acrylate, and KAYARAD HX-220 and 620 introduced into neopentyl glycol hydroxypivalate. Other examples of polyfunctional crosslinking agents suitable for use in the present invention include epoxy acrylates of bisphenol A derivatives, novolac-epoxy acrylates, and urethane-based polyfunctional acrylates, such as U-324A, U15HA and U-4HA. These polyfunctional crosslinking agents may be used alone or as a mixture of two or more thereof.

The polyfunctional crosslinking agent is preferably present in an amount of 1 to 30% by weight, based on the total weight of the composition.

The photoinitiator 4) is selected from the group consisting of: triazine compounds, such as 2,4-trichloromethyl-(4'-methoxyphenyl)-6-triazine, 2,4-trichloromethyl-(4'-methoxystyryl)-6-triazine, 2,4-trichloromethyl-(piperonyl)-6-triazine, 2,4-trichloromethyl-(3',4'-dimethoxyphenyl)-6-triazine and 3-{4-[2,4-bis(trichloromethyl)-s-triazine-6-yl]phenylthio}propanoic acid; biimidazole compounds, such as 2,2'-bis(2-chlorophenyl)-4,4',5,5'-tetraphenylbiimidazole and 2,2'-bis(2,3-dichlorophenyl)-4,4',5,5'-tetraphenylbiimidazole; acetophenone compounds, such as 2-hydroxy-2-methyl-1-phenylpropan-1-one, 1-(4-isopropylphenyl)-2-hydroxy-2-methylpropan-1-one, 4-(2-hydroxyethoxy)-phenyl (2-hydroxy)propyl ketone, 1-hydroxycyclohexyl phenyl ketone, 2,2-dimethoxy-2-phenyl acetophenone, 2-methyl-(4-methylthiophenyl)-2-morpholino-1-propane-1-one(Irgacure-907) and 2-benzyl-2-dimethylamino-1-(4-morpholinophenyl)-butane-1-one(Irgacure-369); O-acyloxime compounds, such as Irgacure OXE 01 (Ciba Geigy) and Irgacure OXE 02 (Ciba Geigy); benzophenone compounds, such as 4,4'-bis(dimethylamino)benzophenone and 4,4'-bis(diethylamino)benzophenone; thioxanthone compounds, such as 2,4-diethylthioxanthone, 2-chlorothioxanthone, isopropylthioxanthone and diisopropylthioxanthone; phosphine oxide compounds, such as 2,4,6-trimethylbenzoyldiphenylphosphine oxide, bis(2,6-dimethoxybenzoyl)-2,4,4-trimethylpentylphosphine oxide and bis(2,6-dichlorobenzoyl)propylphosphine oxide; and coumarine compounds, such as 3,3'-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin and 10,10'-carbonylbis[1,1,7,7-tetramethyl-2,3,6,7-tetrahydro-1H,5H,11H-Cl]-benzopyroano[6,7,8-ij]-quinolizine-11-one. These photoinitiators may be used alone or as a mixture of two or more thereof. The content of the photoinitiator 4) is determined by those skilled in the art.

The content and the kind of the coloring pigment 5) are not particularly limited and can be appropriately selected according to the desired color of a matrix. For example, carbon black is used as the coloring pigment in the production of a black matrix.

In addition to the above-mentioned components, the photosensitive composition of the present invention may further comprise one or more additives selected from the group consisting of surfactants, fillers, antifoaming agents, flame retardants and antioxidants so long as the desired physical properties of the photosensitive composition are not deteriorated. The additives are not specially limited and may be those that are commonly used in the art.

The composition of the present invention is applied to a suitable substrate by any known process such as spin coating, slit-spin coating, roll coating, die coating or curtain coating. The coated substrate is exposed to light and developed to form a photosensitive layer. There is no particular restriction on the exposure and development processes.

The coated substrate can be irradiated with a suitable light source selected from electromagnetic wave, visible light, electron beam, X-ray and laser. The light irradiation can be conducted using known means selected from a high-pressure mercury lamp, a xenon lamp, a carbon arc lamp, a halogen lamp, a cold-cathode tube for a photocopier, a light emitting diode (LED) or a semiconductor laser. There is no particular restriction on the light source and the irradiation means.

Further, the development is carried out to remove an uncured region of the exposed photosensitive layer, leaving a permanent pattern.

A developer for use in the development is not particularly limited and can be appropriately selected according to the intended purpose. Suitable developers are hydroxides, carbonates and bicarbonates of alkali metals and alkaline-earth metals, aqueous ammonia, and aqueous solutions of quaternary ammonium salts. Particularly preferred is an aqueous solution of sodium carbonate.

The developer may be used in combination with a surfactant, a antifoaming agent, an organic base (e.g., benzylamine, ethylenediamine, ethanolamine, tetramethylammonium hydroxide, diethylenetriamine, triethylenepentamine, morpholine or triethanolamine), an organic solvent (e.g., an alcohol, a ketone, an ester, an ether, an amide or a lactone) for development promotion, etc. The developer may be a water-based solution of an organic solvent and water or an aqueous alkaline solution. An organic solvent may be used alone as the developer.

The thickness of the photosensitive layer may vary, for example from 1 to 5 μm, according to the intended purpose.

Mode for Invention

Hereinafter, the present invention will be explained in more detail with reference to the following examples. However, these examples are not intended to limit the present invention.

EXAMPLES

Preparative Example 1

Synthesis of Fluorene-Based Polymer Having Urethane Bonds 84.52 g(0.1393 mol) of 9,9-bisphenol fluorene diglycerolate diacrylate (BPFE) as a diol compound containing a fluorene moiety and 15.48 g (0.0696 mol) of isophorone diisocyanate were dissolved in 214.36 ml of a propyleneglycol monomethylether acetate as a solvent in a 500 ml three-neck flask. The solution was refluxed with stirring for 10 hours to form urethane bonds. To the reaction solution was added 27.55 g (0.1811 mol) of tetrahydrophthalic anhydride. The resulting mixture was allowed to react for 5 hours to give 341.91 g of a fluorene-based polymer containing an acid group.

The fluorene-based polymer was found to have an acid value of 80 mgKOH/g and a weight average molecular weight of 3,500 g/mol on a polystyrene basis, as measured by GPC.

The structure of the fluorene-based polymer having urethane bonds was identified by FT-IR spectroscopy. The results are shown in FIG. 1. The spectrum of FIG. 1 confirms that the isocyanate(NCO) peak around 2,250 $cm^{-1}$ disappeared completely.

Preparative Example 2

Synthesis of Fluorene-Based Polymer Having Urethane Bonds

A fluorene-based polymer was prepared in the same manner as in Example 1, except that 18.12 g (0.1811 mol) of succinic anhydride was used instead of tetrahydrophthalic anhydride.

The fluorene-based polymer was found to have an acid value of 83 mgKOH/g and a weight average molecular weight of 3,300 g/mol on a polystyrene basis, as measured by GPC.

Figure 2:
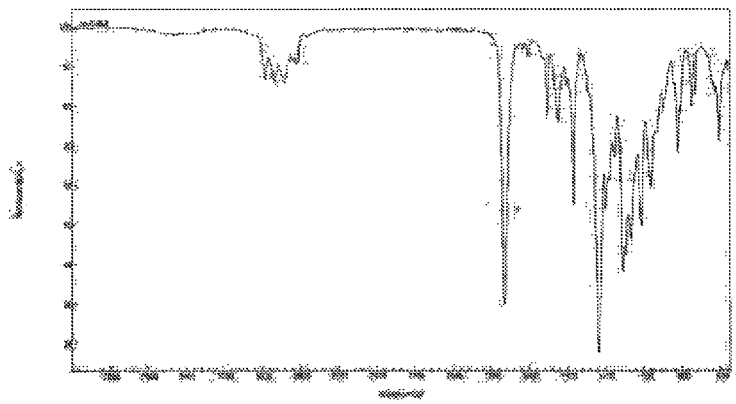

The structure of the fluorene-based polymer having urethane bonds was identified by FT-IR spectroscopy. The results are shown in FIG. 2. The spectrum of FIG. 1 confirms that the isocyanate(NCO) peak around 2,250 $cm^{-1}$ disappeared completely.

Preparative Example 3

Synthesis of Polymer Having Urethane Bonds 97.19 g(0.2002 mol) of bisphenol epoxy acrylate as a diol compound and 22.82 g(0.1027 mol) of isophorone diisocyanate were dissolved in 280 ml of a propyleneglycol monomethylether acetate as a solvent in a 500 ml three-neck flask. The solution was refluxed with stirring for 10 hours to form urethane bonds. To the reaction solution was added 30.45 g (0.2001 mol) of tetrahydrophthalic anhydride. The resulting mixture was allowed to react for 5 hours to give 430.45 g of a polymer containing an acid group.

The polymer was found to have an acid value of 78 mgKOH/g and a weight average molecular weight of 3,400 g/mol on a polystyrene basis, as measured by GPC.

Comparative Preparative Example 1

154.92 g(0.2554 mol) of bisphenol fluorene epoxy acrylate (BPFE) as a diol compound and 45.08 g(0.1532 mol) of diphenyl dianhydride were dissolved in 45.64 ml of a solvent in a 500 ml three-neck flask. The solution was refluxed with stirring for 10 hours to give 245.64 g of a fluorene-based polymer.

The fluorene-based polymer was found to have an acid value of 105 mgKOH/g and a weight average molecular weight of 4,000 g/mol on a polystyrene basis, as measured by GPC.

Example 1

20 g of the fluorene-based polymer prepared in Preparative Example 1, 10 g of dipentaerythritol hexaacrylate(DPHA) as a polyfunctional crosslinking agent, 50 g of carbon black as a coloring pigment, 3.0 g of a photoinitiator and 1 g of a surfactant were dissolved in 50 g of PGMEA as a solvent to prepare a photosensitive resin composition.

The composition was applied to a glass substrate by spin coating such that the coating thickness became 1.0μm after drying, and dried in an oven at 80° C. for 30 minutes to form a photosensitive layer. Then, the photosensitive layer was irradiated with laser light at a wavelength of 405 nm to obtain a desired interconnection pattern. The pattern was spray-developed with an aqueous solution of sodium carbonate(1 wt. %) under a spray pressure of 2.0 kgf/$cm^2$ for 60 seconds to remove the unexposed portion.

Example 2

40 g of the fluorene-based polymer prepared in Preparative Example 2, 15 g of dipentaerythritol hexaacrylate (DPHA) as a polyfunctional crosslinking agent, 50 g of carbon black as a coloring pigment, 4.0 g of a photoinitiator and 1 g of a surfactant were dissolved in 50 g of PGMEA as a solvent to prepare a photosensitive resin composition.

A photosensitive layer was formed using the photosensitive resin composition by the same procedure as in Example 1.

Example 3

20 g of the polymer prepared in Preparative Example 3, 10 g of dipentaerythritol hexaacrylate (DPHA) as a polyfunctional crosslinking agent, 50 g of pigment dispersion as a red color, 3.0 g of a photoinitiator and 1 g of a surfactant were dissolved in 50 g of PGMEA as a solvent to prepare a photosensitive resin composition. A photosensitive layer was formed using the photosensitive resin composition by the same procedure as in Example 1.

Comparative Example 1

A photosensitive resin composition was prepared in the same manner as in Example 1, except that the fluorene-based polymer prepared in Comparative Preparative Example 1 was used. A photosensitive layer was formed using the photosensitive resin composition by the same procedure as in Example 1.

The developability and chemical resistance of the photosensitive resin compositions were evaluated and the sensitivity of the photosensitive layers was measured according to the following procedures. The results are shown in Table 1.

Development margin: The photosensitive layers were developed to form desired patterns. Development margin represents the time when each of the patterns was maintained in its original form before being peeled off. The development margin was judged to be 'O' when the maintenance time of the pattern was relatively long, 'Δ' when the maintenance time of the pattern was relatively short, and 'X' when the pattern was peeled off immediately after pattern formation.

Chemical resistance: After each of the coated substrates was dipped in N-methylpyrrolidone (NMP) at 40° C. for 10 minutes, a change in the appearance of the coating was visually observed. The chemical resistance of the composition was judged to be good 'O' when no change was observed, fair 'Δ' when a slight change in the state of the coating was observed, and poor 'X' when peeling was observed in the appearance of the coating and the solvent was discolored.

Sensitivity: The size of the smallest pixel of the pixels remaining after exposure (dose=100 mJ) of each composition through a line & space mask and development (60 sec) was measured to determine the sensitivity of the composition.

TABLE 1

|  | Development margin | Chemical resistance | Sensitivity (μm) |
|---|---|---|---|
| Example 1 | O | O | <10 |
| Example 2 | O | O | <10 |
| Example 3 | Δ | O | <10 |
| Comparative Example 1 | Δ | Δ | 28 |

As can be seen from the results in Table 1, the photosensitive resin compositions of Examples 1 and 2, each of which was prepared using the novel fluorene-based polymer having urethane bonds as a binder resin, showed better developability, more improved chemical resistance and higher sensitivity than the photosensitive resin composition of Comparative Example 1.

The invention claimed is:

1. A fluorene-based polymer having urethane bonds, represented by Formula 1:

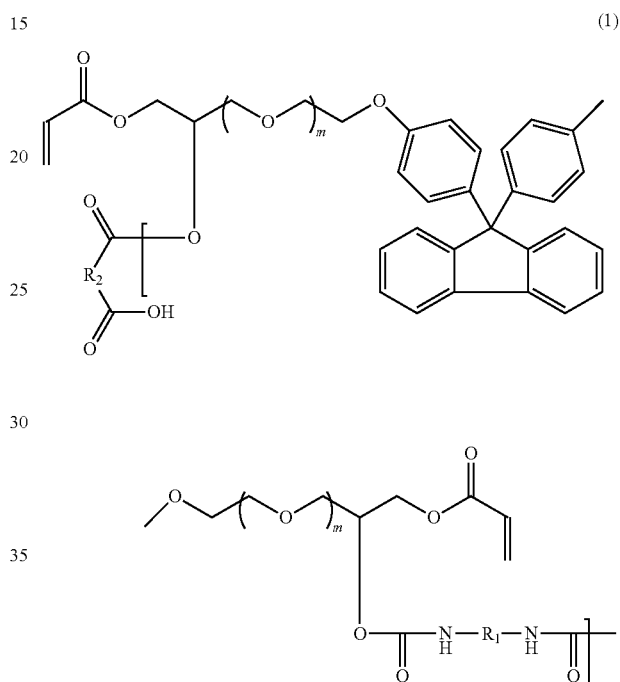

(1)

wherein $R_1$ is a divalent hydrocarbon group derived from a diisocyanate, $R_2$ is a constituent group of an acid derived from an acid anhydride, m is from 0 to 3, and n is from 3 to 8.

2. The fluorene-based polymer according to claim 1, wherein the polymer has an acid value of 60 to 120 KOHmg/g.

3. The fluorene-based polymer according to claim 1, wherein the polymer has a weight average molecular weight of 3,000 to 6,000 on a polystyrene basis.

4. A method for preparing the fluorene-based polymer according to claim 1, the method comprising reacting a diol compound containing a fluorene moiety with a diisocyanate to produce a reaction mixture, and reacting the reaction mixture with an acid anhydride.

5. The method according to claim 4, wherein the diol compound and the diisocyanate are reacted in an equivalent ratio of 1.1:1-3:1.

6. The method according to claim 4, wherein the diol compound is represented by Formula 2:

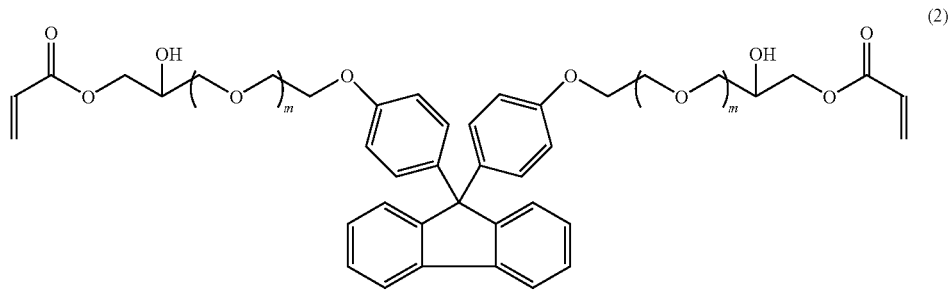

wherein each m is from 0 to 3.

7. The method according to claim 4, wherein the diisocyanate is represented by Formula 3:

wherein $R_1$ is a divalent hydrocarbon group.

8. The method according to claim 7, wherein the diisocyanate is selected from the group consisting of trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate, 2,4,4-trimethylhexamethylene diisocyanate, ω,ω'-diisocyanato-1,3-dimethylbenzene, ω,ω'-diisocyanato-1,4-dimethylbenzene, ω,ω'-diisocyanato-1,3-diethylbenzene, 1,4-tetramethylxylene diisocyanate, 1,3-tetramethylxylene diisocyanate, isophorone diisocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylene bisisocyanate methylcyclohexane, 2,5-isocyanatomethyl bicyclo[2,2,2]heptane, and 2,6-isocyanatomethyl bicyclo[2,2,1]heptane.

9. A method for preparing the fluorine-based polymer of claim 1, the method comprising
reacting a diol compound represented by Formula 4 with a diisocyanate to produce a reaction mixture,

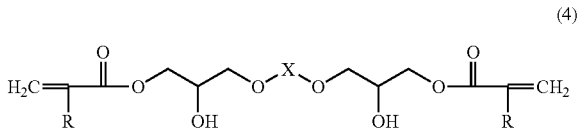

wherein each R is a hydrogen atom or a methyl group, and X is selected from the group consisting of $C_1$-$C_{10}$ alkylene, —(CH$_2$CH$_2$O)$_n$CH$_2$CH$_2$— (n is an integer from 1 to 10), —(CHCH$_3$CH$_2$)$_n$OCHCH$_3$CH$_2$— (n is an integer from 1 to 10),

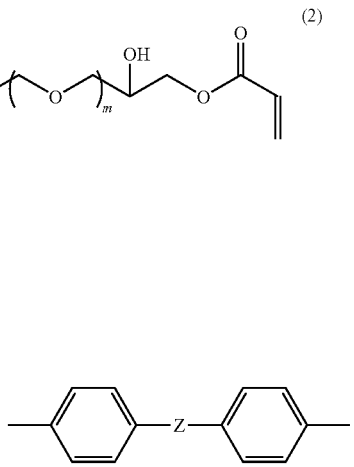

(Z is a direct bond or is selected from the group consisting of $C_1$-$C_6$ alkylene, ketone, —O—, —S—, —SO$_2$—, hexafluoropropylene, —OC$_6$H$_4$O— and —OC$_6$H$_4$C(CH$_3$)$_2$C$_6$H$_4$O—), 9,9-bisphenolfluorenyl, and 9,9-bis(4'-ethoxyphenyl)fluorenyl, and
reacting the reaction mixture with an acid anhydride.

10. The method according to claim 4, wherein the acid anhydride is selected from the group consisting of succinic anhydride, glutaric anhydride, methylsuccinic anhydride, maleic anhydride, methylmaleic anhydride, phthalic anhydride, 1,2,3,6-tetrahydrophthalic anhydride, 3,4,5,6-tetrahydrophthalic anhydride, hexahydrophthalic anhydride, cis-5-norbornene-(endo, exo)-2,3-dicarboxylic anhydride, and mixtures thereof.

11. The method according to claim 4, wherein the acid anhydride is reacted with unreacted residual alcohol groups of the diol compound.

12. A negative-type photosensitive resin composition comprising the fluorene-based polymer according to claim 1.

13. The composition according to claim 12, wherein the fluorene-based polymer is present in an amount of 1 to 30% by weight, based on the total weight of the composition.

14. The composition according to claim 12, further comprising a solvent, a polyfunctional crosslinking agent, a photoinitiator, and a coloring pigment.

15. A black matrix formed using the composition according to claim 12.

16. A color filter comprising the black matrix according to claim 15.

17. A liquid crystal display device comprising the color filter according to claim 16.

18. A black matrix formed using the composition according to claim 13.

19. A black matrix formed using the composition according to claim 14.

* * * * *